United States Patent
Doyle et al.

(10) Patent No.: US 10,531,562 B2
(45) Date of Patent: Jan. 7, 2020

(54) HEAT-ACTIVATED CONDUCTIVE SPINEL MATERIALS FOR PRINTED CIRCUIT BOARD VIA OVERCURRENT PROTECTION

(71) Applicant: International Business Machines Corporation, Armonk, NY (US)

(72) Inventors: Matthew S. Doyle, Chatfield, MN (US); Jeffrey N. Judd, Oronoco, MN (US); Joseph Kuczynski, North Port, FL (US); Scott D. Strand, Rochester, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 15/609,103

(22) Filed: May 31, 2017

(65) Prior Publication Data

US 2018/0352652 A1 Dec. 6, 2018

(51) Int. Cl.
*H05K 1/02* (2006.01)
*H05K 1/18* (2006.01)

(52) U.S. Cl.
CPC ........... *H05K 1/0293* (2013.01); *H05K 1/181* (2013.01); *H05K 2201/0326* (2013.01); *H05K 2201/10151* (2013.01); *H05K 2203/125* (2013.01)

(58) Field of Classification Search
CPC ...... H05K 1/0293; H05K 1/181; H05K 1/115; H05K 2201/0326; H05K 2201/10151; H02H 3/08
See application file for complete search history.

(56) References Cited

U.S. PATENT DOCUMENTS

| | | | |
|---|---|---|---|
| 4,454,585 A | 6/1984 | Ele | |
| 4,743,847 A | 5/1988 | Frushour | |
| 5,180,440 A | 1/1993 | Siegel et al. | |
| 6,340,817 B1 | 1/2002 | Gelbart | |

(Continued)

FOREIGN PATENT DOCUMENTS

| | | |
|---|---|---|
| CN | 102361536 A | 2/2012 |
| CN | 104659756 A | 5/2015 |

(Continued)

*Primary Examiner* — Scott Bauer
(74) *Attorney, Agent, or Firm* — Daniel Yeates

(57) ABSTRACT

A process of utilizing a heat-activated conductive spinel material for PCB via overcurrent protection includes forming a PCB laminate structure that includes a spinel-doped insulator layer having a heat-activated conductive spinel material incorporated into a dielectric material as a spinel-based electrically non-conductive metal oxide. A sensing via is formed in the PCB laminate structure at a location that is proximate to a power via in the PCB laminate structure. The sensing via is electrically isolated from the power via by a region of the spinel-doped insulator layer and is electrically connected to a monitoring component configured to detect current flow through the sensing via that results from an overcurrent event in the power via that generates sufficient heat to cause the spinel-based electrically conductive metal oxide to release metal nuclei into the region to provide a conductive pathway through the region from the power via to the sensing via.

20 Claims, 5 Drawing Sheets

(56) References Cited

U.S. PATENT DOCUMENTS

| | | | |
|---|---|---|---|
| 8,449,949 B2 * | 5/2013 | Lee | ........................ B32B 27/08 |
| | | | 427/554 |
| 8,528,203 B2 | 9/2013 | Balcome et al. | |
| 2012/0312589 A1 | 12/2012 | Balcome et al. | |
| 2015/0144385 A1 * | 5/2015 | Ohashi | ................... H05K 1/092 |
| | | | 174/258 |

FOREIGN PATENT DOCUMENTS

| | | | |
|---|---|---|---|
| CN | 105203897 A | | 12/2015 |
| JP | 2001345561 A | | 12/2001 |
| JP | 3441941 B2 | * | 9/2003 |
| JP | 2015010796 A | | 1/2015 |
| JP | 2015210236 A | | 11/2015 |

* cited by examiner

HEAT-ACTIVATED CONDUCTIVE SPINEL MATERIALS FOR PRINTED CIRCUIT BOARD VIA OVERCURRENT PROTECTION

BACKGROUND

While automated computer aided design (CAD) tools are capable of providing computer aided design checking, errors may still occur in the design of a printed circuit board (PCB) for electronic hardware. Some of the errors that may be released to manufacturing represent a form of minimal power-to-power or power-to-ground clearance between voltage shapes and/or PCB vias, pins, or component pads. In high-power PCB applications, there is the potential for direct current (DC) power shorting "events" which may be caused by PCB layer mis-registration or another event in which more current is carried by a single PCB via than was intended during the design of the electronic hardware. Such DC power shorting events may include PCB burns, smoke, and potentially fire.

SUMMARY

According to an embodiment, a process of utilizing a heat-activated conductive spinel material for PCB via overcurrent protection is disclosed. The process includes forming a PCB laminate structure that includes a spinel-doped insulator layer. The spinel-doped insulator layer includes a heat-activated conductive spinel material incorporated into a dielectric material as a spinel-based electrically non-conductive metal oxide. The process also includes forming a sensing via in the PCB laminate structure at a location that is proximate to a power via in the PCB laminate structure. The sensing via is electrically isolated from the power via by a region of the spinel-doped insulator layer. The process further includes electrically connecting the sensing via to a monitoring component that is configured to detect current flow through the sensing via that results from an overcurrent event in the power via. The overcurrent event generates sufficient heat to cause the spinel-based electrically conductive metal oxide to release metal nuclei into the region to provide a conductive pathway through the region from the power via to the sensing via.

According to another embodiment, a system for PCB via overcurrent protection is disclosed. The system includes a PCB laminate structure that includes a spinel-doped insulator layer, a power via disposed within the PCB laminate structure, a sensing via disposed within the PCB laminate structure at a location that is proximate to the power via, and a monitoring component electrically connected to the sensing via. The spinel-doped insulator layer includes a heat-activated conductive spinel material incorporated into a dielectric material as a spinel-based electrically non-conductive metal oxide. The sensing via is electrically isolated from the power via by a region of the spinel-doped insulator layer. The monitoring component is configured to detect current flow through the sensing via that results from an overcurrent event in the power via generating sufficient heat to cause the spinel-based electrically conductive metal oxide to release metal nuclei into the region to provide a conductive pathway through the region from the power via to the sensing via.

According to another embodiment, a printed circuit board is disclosed. The printed circuit board includes a PCB laminate structure that includes a spinel-doped insulator layer, a power via disposed within the PCB laminate structure, and a sensing via disposed within the PCB laminate structure. The spinel-doped insulator layer includes a heat-activated conductive spinel material incorporated into a dielectric material as a spinel-based electrically non-conductive metal oxide. The sensing via is located proximate to the power via and is electrically isolated from the power via by a region of the spinel-doped insulator layer. The printed circuit board further includes an electrical connector to connect the sensing via to a monitoring component. The monitoring component is configured to detect current flow through the sensing via that results from an overcurrent event in the power via.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes heat-activated conductive spinel materials for PCB via overcurrent protection. As used herein, the term "heat-activated conductive spinel material" is used to refer to a spinel-based material that is rendered electrically conductive when exposed to sufficient heat to break down a spinel-based electrically non-conductive metal oxide into metal nuclei. In the present disclosure, a spinel-based electrically non-conductive metal oxide is incorporated into a dielectric material of an insulator layer (or multiple insulator layers) of a printed circuit board to form a spinel-doped insulator layer (or multiple spinel-doped insulator layers). In the present disclosure, a sensing via may be positioned at a location that is proximate to one or more current-carrying vias (also referred to herein as "DC power vias") but that is separated from the DC power via(s) by a region of the spinel-doped insulator layer in order to electrically isolate the sensing via from the DC power via(s) during normal operations.

A high current event in a particular DC power via may result in rapid heating of the region adjacent to the particular DC power via, resulting in breakdown of the spinel-based electrically non-conductive metal oxide in the region to release metal nuclei into the region. The metal nuclei sites are conductive, thereby rendering the region electrically conductive, such that the sensing via is no longer electrically isolated from the particular DC power via. The sensing via is electrically connected to a monitoring component that may be configured to perform a corrective action responsive to detecting current flow through the sensing via. In some cases, the corrective action may include disabling or rerouting DC power before sufficient energy is added to the dielectric material of the printed circuit board such that smoke begins to rise.

Figure 1:
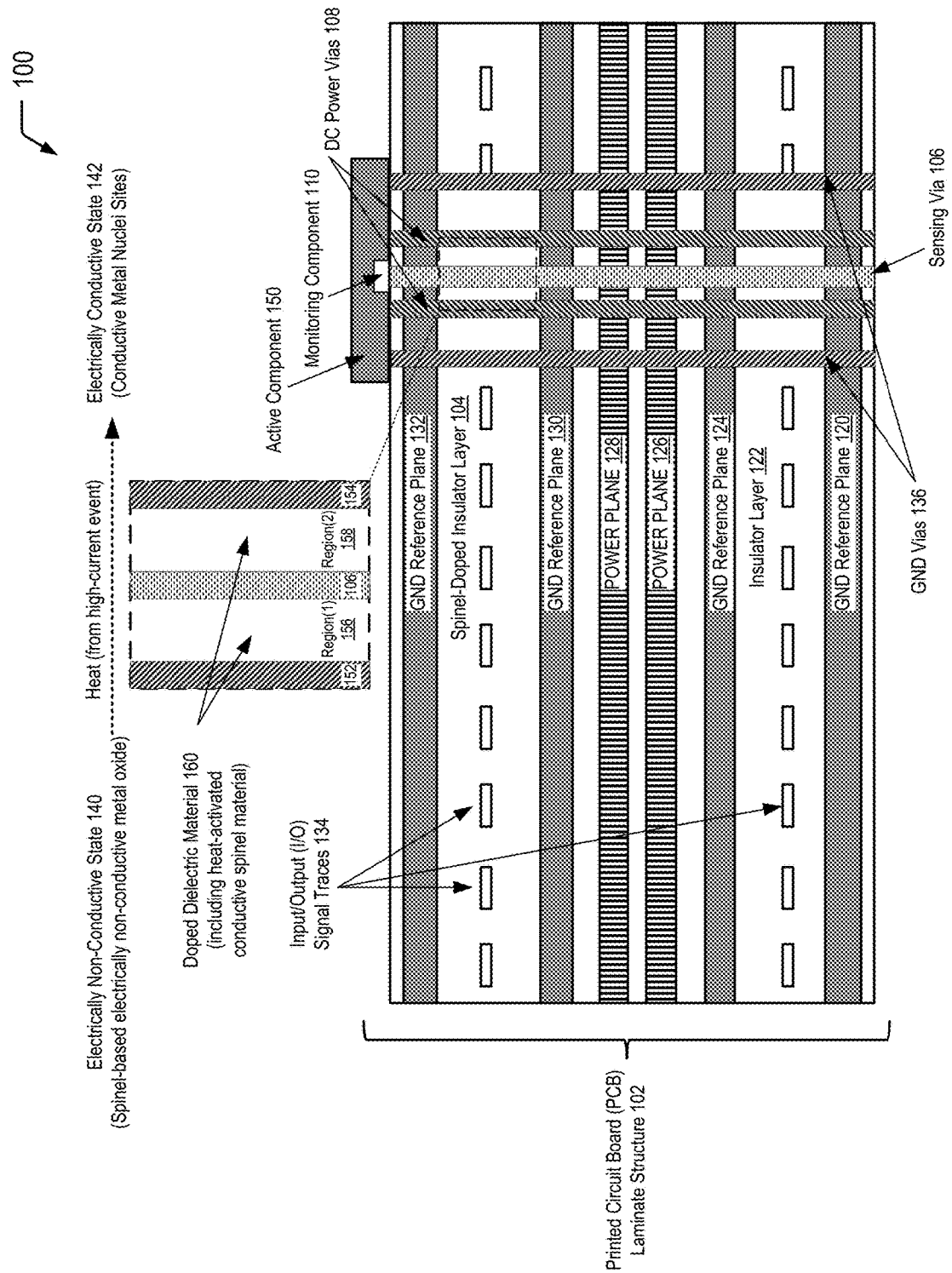
FIG. 1 is a diagram illustrating a system that utilizes a heat-activated conductive spinel material for printed circuit board (PCB) via overcurrent protection, according to one embodiment.

Referring to FIG. 1, a diagram illustrates a system 100 that utilizes a heat-activated conductive spinel material for PCB via overcurrent protection, according to one embodiment. FIG. 1 illustrates a cross-sectional view of a portion of a PCB laminate structure 102 that includes an insulator layer (or multiple insulator layers) having a heat-activated conductive spinel material incorporated into a dielectric material, referred to herein as a spinel-doped insulator layer 104. The spinel-doped insulator layer 104 separates a sensing via 106 from one or more adjacent DC power vias 108 configured to carry current between one or more electronic components. During normal operations, as illustrated and further described herein with respect to FIG. 2, the heat-activated conductive spinel material in the spinel-doped insulator layer 104 corresponds to a spinel-based electrically non-conductive metal oxide that electrically isolates the sensing via 106 from the adjacent DC power vias 108. As illustrated and further described herein with respect to FIG. 3, an overcurrent event may generate sufficient heat to break down the spinel-based electrically non-conductive metal oxide to release metal nuclei in an adjacent region of the spinel-doped insulator layer 104. The metal nuclei sites in the region are electrically conductive, such that a conductive pathway is formed through the region to the sensing via 104. FIG. 1 further illustrates that the sensing via 104 may be electrically connected to a monitoring component 110, and the conductive pathway enables current to flow through the sensing via 104 to the monitoring component 110. As illustrated and further described herein with respect to FIG. 4, the monitoring component 110 may be configured to perform a corrective action responsive to detecting current flow through the sensing via 104. In some cases, the corrective action may include disabling or rerouting DC power before sufficient energy is added to the dielectric material such that smoke begins to rise.

In the particular embodiment depicted in FIG. 1, the PCB laminate structure 102 includes a first ground (GND) reference plane 120 and an insulator layer 122 separating the first ground reference plane 120 from a second ground reference plane 124. In the example of FIG. 1, a first power plane 126 and a second power plane 128 are disposed between the second ground reference plane 124 and a third ground reference plane 130 (with insulating layers disposed between the various planes, reference characters omitted in FIG. 1). In the particular embodiment depicted in FIG. 1, the spinel-doped insulator layer 104 is disposed between the second ground reference plane 124 and a third ground reference plane 132. FIG. 1 further illustrates that a plurality of input/output (I/O) signal traces 134 may be embedded within the insulator layer 122 and the spinel-doped insulator layer 104 of the PCB laminate structure 102.

As described further herein, the spinel-doped insulator layer 104 includes a heat-activated conductive spinel material that may transition from an electrically non-conductive state 140 to an electrically conductive state 142 when exposed to sufficient heat generated by an overcurrent event in a particular current-carrying via. In some cases, the insulator layer 122 separating the first ground reference plane 120 from the second ground reference plane 124 may represent a second spinel-doped insulator layer. Thus, it will be appreciated that a single insulator layer of the PCB laminate structure 102 may be doped with a heat-activated conductive spinel material, or multiple insulator layers of the PCB laminate structure 102 may be doped with the heat-activated conductive spinel material.

In the example of FIG. 1, the DC power vias 108 and one or more ground (GND) vias 136 are positioned to electrically connect to an active component 150 that includes, or is otherwise electrically connected to, the monitoring component 110. As illustrated and further described herein with respect to FIG. 4, the active component 150 may correspond to a processor, an application specific integrated circuit (ASIC), or a field programmable gate array (FPGA), among other alternatives. While not shown in the example of FIG. 1, the DC power vias 108, the ground vias 136, and the sensing via 106 may be electrically connected to the monitoring component 110 via individual solder bumps.

FIG. 1 illustrates a selected portion (identified by dashed lines) of the cross-sectional view of the PCB laminate structure 102 in an exploded view to show that the DC power vias 108 may include a first DC power via 152 and a second DC power via 154. The exploded view further illustrates that a first region 156 of the spinel-doped insulator layer 104 separates the sensing via 106 from the first DC power via 152, and a second region 158 of the spinel-doped insulator layer 104 separates the sensing via 106 from the second DC power via 154. The exploded view illustrates that the first region 156 and the second region 158 of the spinel-doped insulator layer 104 corresponds to a doped dielectric material 160. The doped dielectric material 160 includes a spinel-based material disposed within a dielectric material that may be used to form one or more insulator layers of the PCB laminate structure 102 (e.g., the insulator layer 122 disposed between the first GND reference plane 120 and the second GND reference plane 124). In some cases, the spinel-based material may be incorporated into a pre-impregnated material that is utilized during formation of the PCB laminate structure 102. In other cases, a particular region (or regions) of a particular insulator layer (or layers), such as areas of a PCB that are identified as "critical" power delivery sections, may be selectively doped with the spinel-based material.

In the electrically non-conductive state 140, the spinel-based material corresponds to a spinel-based electrically non-conductive metal oxide such that the doped dielectric material 160 functions as an insulating material. Thus, in the electrically non-conductive state 140, the first region 156 of the spinel-doped insulator layer 104 electrically isolates the sensing via 106 from the first DC power via 146, and the second region 158 of the spinel-doped insulator layer 104 electrically isolates the sensing via 106 from the second DC power via 154.

The spinel-based electrically non-conductive metal oxide may be, for example, spinel-based higher oxides which contain at least two different kinds of cations and have a spinel structure or spinel-related structure, and which break up to create metal nuclei in the heated region of the insulator layer but remain unchanged in other areas of the insulator layer. Examples of spinels include mixed metal oxides of magnesium and aluminum, but the magnesium may be wholly or partially replaced by iron, zinc and/or manganese, and the aluminum may be wholly or partially replaced by iron and/or chromium. Spinel-related mixed oxide structures also may contain nickel and/or cobalt. It may be advantageous if the spinel or spinel-related structure contains copper, chromium, iron, cobalt, nickel or a mixture of two or more of the foregoing. Copper may be particularly advantageous (e.g., the copper-containing spinel PK 3095 made by Ferro GmbH). Those skilled in the art will appreciate, however, that any suitable spinel-based electrically non-conductive metal oxide may be utilized.

As described further herein, an overcurrent event in the first DC power via 152 and/or the second DC power via 154 may generate sufficient heat to break down the spinel-based electrically non-conductive metal oxide to release metal nuclei into the first region 156 and/or the second region 158. The metal nuclei sites are conductive, thereby providing a conductive pathway through the first region 156 and/or the second region 158 to the sensing via 106. Thus, in the electrically conductive state 142, the doped dielectric material 160 in the first region 156 and/or the second region 158 functions as a conductive material. As an example, an overcurrent event in the first DC power via 152 may generate sufficient heat to break down the spinel-based electrically non-conductive metal oxide to release metal nuclei into the first region 156, rendering the first region 156 electrically conductive to provide a conductive pathway from the first DC power via 152 to the sensing via 106. As another example, an overcurrent event in the second DC power via 154 may generate sufficient heat to break down the spinel-based electrically non-conductive metal oxide to release metal nuclei into the second region 158, rendering the second region 158 electrically conductive to provide a conductive pathway from the second DC power via 154 to the sensing via 106.

During normal operations corresponding to the electrically non-conductive state 140, the sensing via 106 is electrically connected to the monitoring component 110 but does not carry current to the monitoring component 110 due to the electrical isolation of the sensing via 106 from the DC power vias 108. When the sensing via 106 is no longer electrically isolated from one or more of the DC power vias 108 as a result of the heat generated by an overcurrent event, the sensing via 106 may carry current to the monitoring component 110. The monitoring component 110 (or another component associated with the active component 150) may be configured to perform a corrective action responsive to detecting current flow through the sensing via 106. In some cases, the corrective action may include disabling or rerouting DC power before sufficient energy is added to the dielectric material of the spinel-doped insulator layer 104 such that smoke begins to rise.

As an illustrative example (as further described herein with respect to FIGS. 3 and 4), in the electrically non-conductive state 140, the spinel-based material disposed within the doped dielectric material 160 in the first region 156 corresponds to a spinel-based electrically non-conductive metal oxide such that the first region 156 functions as an insulator material to prevent current from flowing between the first DC power via 152 and the sensing via 106. Thus, when the first region 156 is in the electrically non-conductive state 140, the monitoring component 110 does not detect current flow through the sensing via 106. An overcurrent event in the first DC power via 152 may generate sufficient heat to break down the spinel-based electrically non-conductive metal oxide in the first region 156 to release metal nuclei into the first region 156 such that the first region 156 functions as a conductive material to enable current to flow from the first DC power via 152 to the monitoring component 110 through the sensing via 106. The monitoring component 110 detects the current flow through the sensing via 106 and may perform one or more corrective actions responsive to detecting the current flow. In some cases, the corrective action(s) may include disabling or rerouting DC power before sufficient energy is added to the dielectric material (e.g., in the first region 156 as well as a region of dielectric material between the first DC power via 152 and one of the GND vias 136) such that smoke begins to rise.

As another example, in the electrically non-conductive state 140, the spinel-based material disposed within the doped dielectric material 160 in the second region 158 corresponds to a spinel-based electrically non-conductive metal oxide such that the second region 158 functions as an insulator material to prevent current from flowing between the second DC power via 154 and the sensing via 106. Thus, when the second region 158 is in the electrically non-conductive state 140, the monitoring component 110 does not detect current flow through the sensing via 106. An overcurrent event in the second DC power via 154 may generate sufficient heat to break down the spinel-based electrically non-conductive metal oxide in the second region 158 to release metal nuclei into the second region 158 such that the second region 158 functions as a conductive material to enable current to flow from the second DC power via 154 to the monitoring component 110 through the sensing via 106. The monitoring component 110 detects the current flow through the sensing via 106 and may perform one or more corrective actions responsive to detecting the current flow. In some cases, the corrective action(s) may include disabling or rerouting DC power before sufficient energy is added to the dielectric material (e.g., in the second region 158 as well as a region of dielectric material between the second DC power via 154 and one of the GND vias 136) such that smoke begins to rise.

Thus, FIG. 1 illustrates an example of a system of utilizing a heat-activated conductive spinel material for PCB via overcurrent protection. During normal operations, the heat-activated conductive spinel material corresponds to a spinel-based electrically non-conductive metal oxide that electrically isolates a sensing via from one or more adjacent DC power vias. An overcurrent event in a particular DC power via may generate sufficient heat to break down the spinel-based electrically non-conductive metal oxide into metal nuclei. The metallic nuclei sites provide a conductive pathway to the sensing via, such that current may flow through the sensing via to a monitoring component. The monitoring component may perform a corrective action responsive to detecting current flow through the sensing via, such as disabling or rerouting DC power before thermal degradation of a dielectric material that may result from the heat generated by the overcurrent event.

Figure 2:
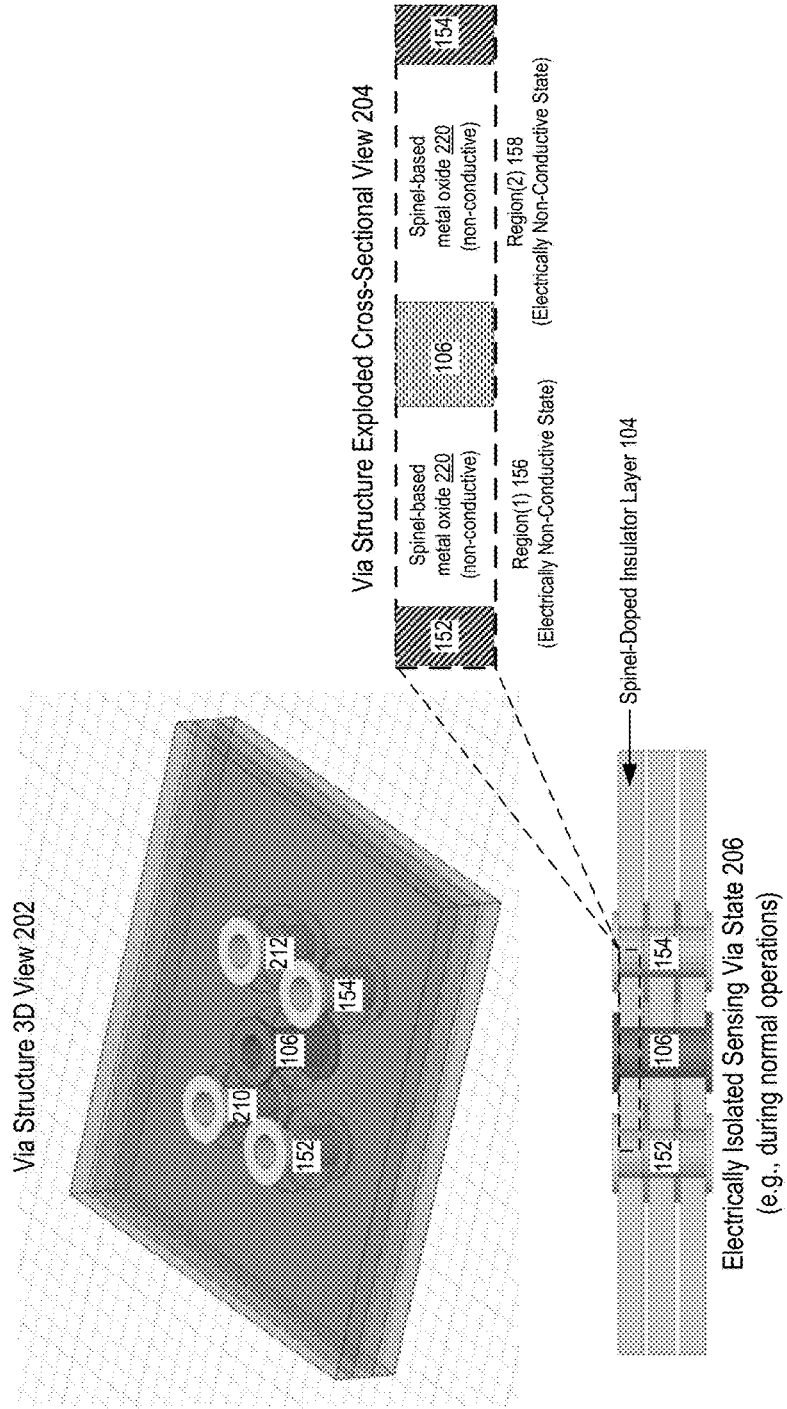
FIG. 2 is a diagram illustrating multiple views of a via structure that includes a sensing via to be utilized for PCB overcurrent protection, in which a heat-activated conductive spinel material is in an electrically non-conductive state to electrically isolate the sensing via from an adjacent current-carrying via during normal operations, according to one embodiment.

Referring to FIG. 2, a diagram 200 illustrates multiple views of a via structure that includes a sensing via to be utilized for PCB overcurrent protection, according to one embodiment. In FIG. 2, a heat-activated conductive spinel material is in an electrically non-conductive state to electrically isolate a sensing via from an adjacent current-carrying via during normal operations. In FIG. 2, a three-dimensional (3D) view 202 illustrates an example of a via structure that may correspond to the via structure depicted in the cross-sectional view of FIG. 1. FIG. 2 further illustrates an exploded cross-sectional view 204 of a portion of the via structure in an electrically isolated sensing via state 206 (e.g., during normal operations).

The 3D view 202 of the via structure illustrates that the sensing via 106 is disposed between multiple DC power vias 108, as illustrated and previously described herein with respect to FIG. 1. In FIG. 2, the DC power vias 108 include the first DC power via 152 and the second DC power via 154 as illustrated in the two-dimensional cross-sectional view of FIG. 1. FIG. 2 further illustrates that, in some embodiments, the sensing via 106 may be positioned at a location that is proximate to more than two DC power vias. In the example of FIG. 2, the additional DC power vias include a third DC power via 210 and a fourth DC power via 212. As with the first DC power via 152 and the second DC power via 154, in the electrically isolated via state 206, the sensing via 106 is electrically isolated from the third DC power via 210 and the fourth DC power via 212. As illustrated and further described herein with respect to FIG. 3, the positioning of the sensing via 106 at a location that is adjacent to the four current-carrying vias 152, 154, 210, and 212 may enable the monitoring component 110 (not shown in FIGS. 2 and 3) to be utilized to detect an overcurrent event in each of the four current-carrying vias 152, 154, 210, and 212.

The exploded cross-sectional view 204 illustrates that, in the electrically isolated via state 206, the first region 156 of the spinel-doped insulator layer 104 between the sensing via 106 and the first DC power via 152 is in an electrically non-conductive state. FIG. 2 illustrates that, in the electrically non-conductive state, the spinel-based material in the first region 156 corresponds to a spinel-based electrically non-conductive metal oxide 220 such that the first region 156 of the spinel-doped insulator layer 104 electrically isolates the sensing via 106 from the first DC power via 152 during normal operations. The exploded cross-sectional view 204 further illustrates that, in the electrically isolated via state 206, the second region 158 of the spinel-doped insulator layer 104 between the sensing via 106 and the second DC power via 154 is in an electrically non-conductive state. FIG. 2 illustrates that, in the electrically non-conductive state, the spinel-based material in the second region 158 corresponds to the spinel-based electrically non-conductive metal oxide 220 such that the second region 158 of the spinel-doped insulator layer 104 electrically isolates the sensing via 106 from the second DC power via 154 during normal operations. While not shown in the exploded cross-sectional view 204, it will be appreciated that the sensing via 106 is also electrically isolated from the third DC power via 210 and the fourth DC power via 212 in the electrically isolated via state 206.

As previously described herein with respect to FIG. 1, the spinel-based electrically non-conductive metal oxide 220 may be, for example, spinel-based higher oxides which contain at least two different kinds of cations and have a spinel structure or spinel-related structure, and which break up to create metal nuclei in the heated region of the insulator layer but remain unchanged in other areas of the insulator layer. Examples of spinels include mixed metal oxides of magnesium and aluminum, but the magnesium may be wholly or partially replaced by iron, zinc and/or manganese, and the aluminum may be wholly or partially replaced by iron and/or chromium. Spinel-related mixed oxide structures also may contain nickel and/or cobalt. It may be advantageous if the spinel or spinel-related structure contains copper, chromium, iron, cobalt, nickel or a mixture of two or more of the foregoing. Copper may be particularly advantageous (e.g., the copper-containing spinel PK 3095 made by Ferro GmbH). Those skilled in the art will appreciate, however, that any suitable spinel-based electrically non-conductive metal oxide may be utilized.

Thus, FIG. 2 illustrates that, during normal operations, the heat-activated conductive spinel material in the spinel-doped insulator layer corresponds to a spinel-based electrically non-conductive metal oxide that electrically isolates a sensing via from one or more adjacent DC power vias. As illustrated and further described herein with respect to FIG. 3, an overcurrent event in a particular DC power via may generate sufficient heat to break down the spinel-based electrically non-conductive metal oxide into metal nuclei. The metallic nuclei sites provide a conductive pathway to the sensing via, such that current may flow through the sensing via to a monitoring component in order to perform a corrective action.

Figure 3:
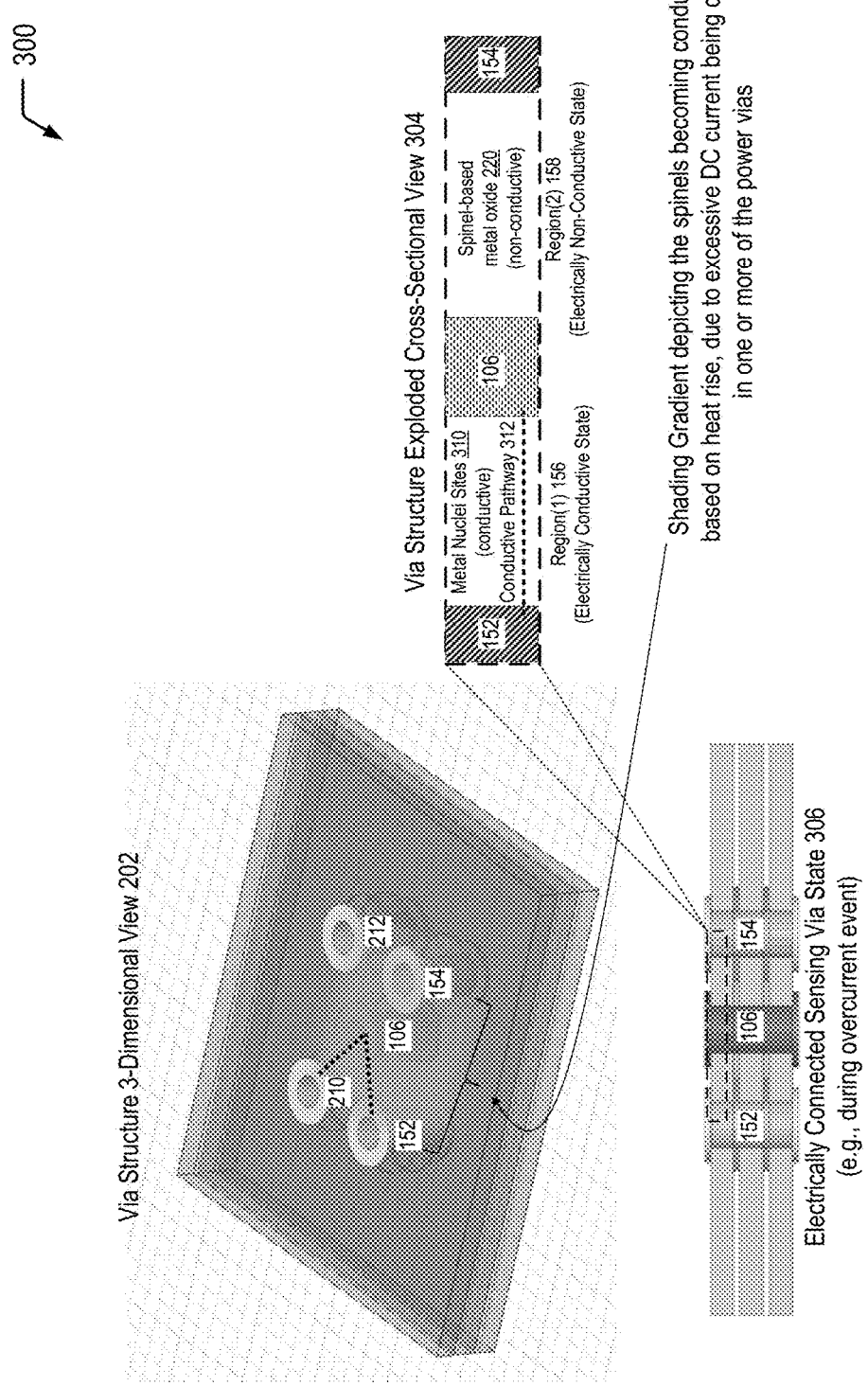
FIG. 3 is a diagram illustrating multiple views of the via structure depicted in FIG. 2 in which the heat-activated conductive spinel material is in the electrically conductive state to provide a conductive pathway to the sensing via for PCB via overcurrent protection, according to one embodiment.

Referring to FIG. 3, a diagram 300 illustrates multiple views of the via structure depicted in FIG. 2. In FIG. 3, the heat-activated conductive spinel material is in the electrically conductive state to provide a conductive pathway to the sensing via for PCB via overcurrent protection. In FIG. 3, the 3D view 202 of the via structure further includes a shading gradient depicting the spinels becoming conductive based on heat rise, due to excessive DC current being carried in one or more of the power vias. FIG. 3 further illustrates an exploded cross-sectional view 304 of a portion of the via structure in an electrically connected sensing via state 306.

The exploded cross-sectional view 304 illustrates an example in which the first region 156 of the spinel-doped insulator layer 104 between the sensing via 106 and the first DC power via 152 is in an electrically conductive state. In the example of FIG. 3, an overcurrent event in the first DC power via 152 and/or the third DC power via 210 may generate sufficient heat to break down the spinel-based electrically non-conductive metal oxide 220 in the first region 156 to release metal nuclei into the first region 156. The metal nuclei sites 310 are conductive, thereby providing a conductive pathway 312 through the first region 156 to the sensing via 106. The exploded cross-sectional view 304 further illustrates an example in which the second region 158 of the spinel-doped insulator layer 104 is not exposed to sufficient heat to release metal nuclei into the second region 158. As such, in the example of FIG. 3, the second region 158 of the spinel-doped insulator layer 104 between the sensing via 106 and the second DC power via 154 remains in the electrically non-conductive state, such that the sensing via 106 remains electrically isolated from the second DC power via 154.

Thus, FIG. 3 illustrates that an overcurrent event in a particular DC power via may generate sufficient heat to break down the spinel-based electrically non-conductive metal oxide in an adjacent region of the spinel-doped insulator layer into metal nuclei. The conductive pathway to the sensing via provided by the metallic nuclei sites enables current to flow through the sensing via to a monitoring component, which may perform a corrective action responsive to detecting the current flow.

Figure 4:
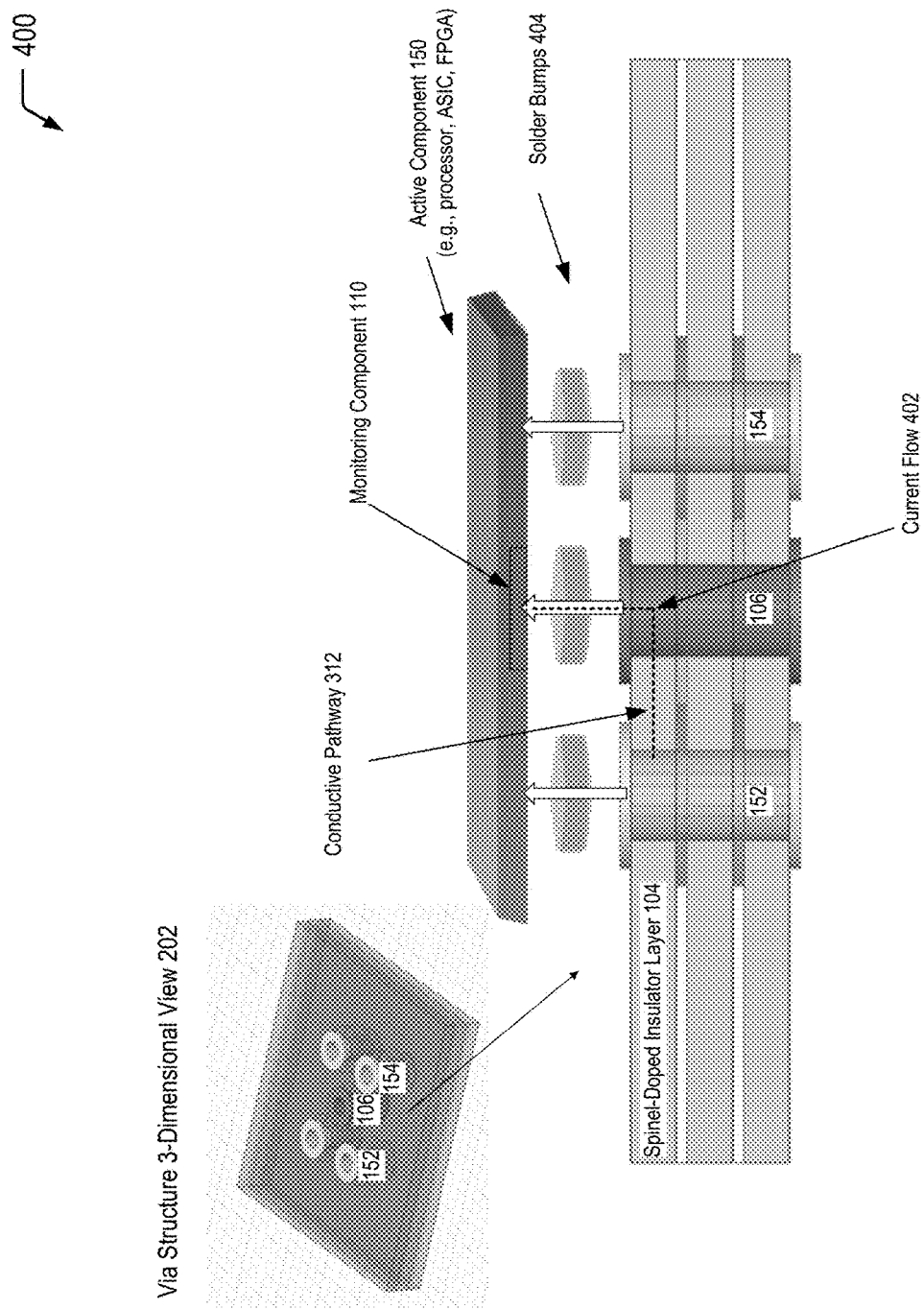
FIG. 4 is a diagram illustrating an example of a PCB via overcurrent protection system that includes a monitoring component configured to perform a corrective action responsive to detecting current flow through the sensing via.

Referring to FIG. 4, a diagram 400 illustrates an example of a PCB via overcurrent protection system that includes a monitoring component configured to perform a corrective action responsive to detecting current flow through a sensing via. In FIG. 4, a power/ground short event or other overcurrent event results in the formation of the conductive pathway 312 depicted in FIG. 3. FIG. 4 illustrates that the conductive pathway 312 results in current flow 402 through the sensing via 106 to the monitoring component 110. Responsive to detecting the current flow 402, the monitoring component 110 may be configured to perform a corrective action.

FIG. 4 illustrates that solder bumps 404 may be utilized to electrically connect the first DC power via 152 to the active component 150, to electrically connect the second DC power via 154 to the active component 150, and to electrically connect the sensing via 106 to the monitoring component 110. During normal operations corresponding to the electrically isolated sensing via state 206 described herein with respect to FIG. 2, the sensing via 106 is electrically connected to the monitoring component 110 by way of one of the solder bumps 406, but the sensing via 106 does not carry current to the monitoring component 110 due to the electrical isolation of the sensing via 106. FIG. 4 illustrates an example in which the heat generated by the overcurrent event results in the sensing via 106 no longer being electrically isolated from the first DC power via 152, corresponding to the electrically connected sensing via state 306 described herein with respect to FIG. 3. In response to detecting the current flow 402 through the sensing via 106, the monitoring component 110 may initiate one or more corrective actions, such as disabling DC power flow or rerouting DC power away from the first DC power via 152 before sufficient energy is added to the dielectric material adjacent to the first DC power via 152 such that smoke begins to rise.

Figure 5:
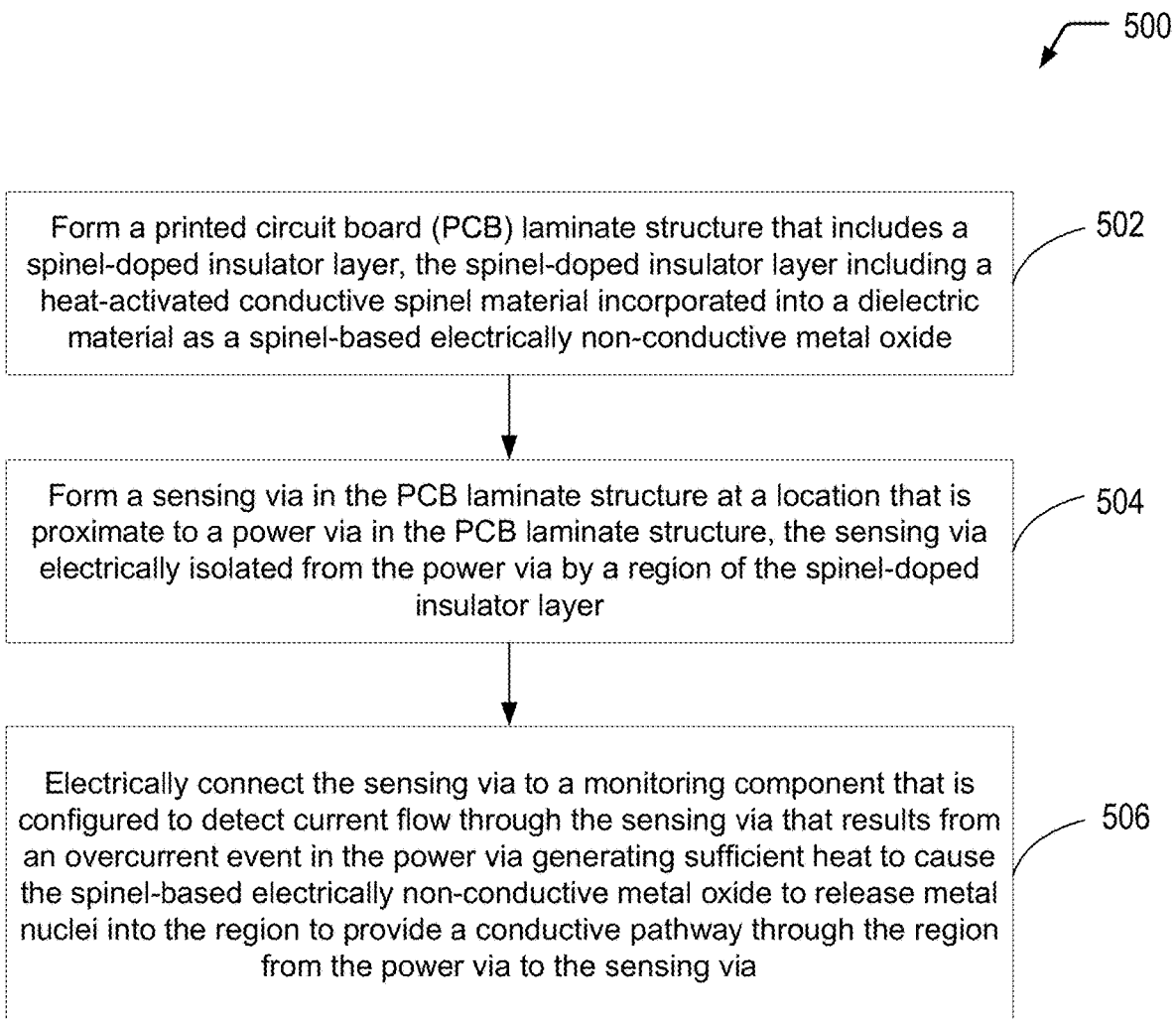
FIG. 5 is a flow diagram depicting a process of utilizing a heat-activated conductive spinel material for PCB via overcurrent protection, according to one embodiment.

Referring to FIG. 5, a flow diagram illustrates a particular embodiment of a process 500 of utilizing a heat-activated conductive spinel material for PCB via overcurrent protection.

The process 500 includes forming a PCB laminate structure that includes a spinel-doped insulator layer, at 502. The spinel-doped insulator layer includes a heat-activated conductive spinel material incorporated into a dielectric material as a spinel-based electrically non-conductive metal oxide. For example, referring to FIG. 1, the PCB laminate structure 102 may include the spinel-doped insulator layer 104 that includes a heat-activated conductive spinel material incorporated into a dielectric material (identified as the doped dielectric material 160 in FIG. 1). FIG. 2 illustrates that, in the electrically isolated sensing via state 206, the heat-activated conductive spinel material corresponds to the spinel-based electrically non-conductive metal oxide 220.

The process 500 includes forming a sensing via in the PCB laminate structure at a location that is a proximate to a power via in the PCB laminate structure, at 504. The sensing via is electrically isolated form the power via by a region of the spinel-doped insulator layer. For example, referring to FIG. 1, the sensing via 106 disposed within the PCB laminate structure 102 is located proximate to the first DC power via 152 and is electrically isolated from the first DC power via by the first region 156 of the spinel-doped insulator layer 104. FIG. 1 further illustrates an example in which the sensing via 106 is located proximate to the second DC power via 154 and is electrically isolated from the second DC power via by the second region 158 of the spinel-doped insulator layer 104. Further, as illustrated in the example of FIG. 2, the sensing via 106 may be disposed at a location that is proximate to additional DC power vias but is electrically isolated from the additional DC power vias, including the third DC power via 210 and the fourth DC power via 212.

The process 500 includes electrically connecting the sensing via to a monitoring component that is configured to detect current flow through the sensing via, at 506. The current flow results from an overcurrent event in the power via generating sufficient heat to cause the spinel-based electrically non-conductive metal oxide to release metal nuclei into the region to provide a conductive pathway through the region from the power via to the sensing via. For example, referring to FIG. 1, the sensing via 104 is electrically connected to the monitoring component 110. As illustrated and further described herein with respect to FIG. 4, the monitoring component 110 is configured to detect the current flow 402 through the sensing via 106. The current flow 402 results from an overcurrent event in the power via (e.g., the first DC power via 152) generating sufficient heat to cause the spinel-based electrically conductive metal oxide 220 (as depicted in the electrically isolated sensing via state 206 of FIG. 2) to release metal nuclei into the first region 156 to provide the conductive pathway 312 through the first region 156 from the first DC power via 152 to the sensing via 106 (as depicted in the electrically connected sensing via state 306 of FIG. 3).

Thus, FIG. 5 illustrates an example of a process of utilizing a heat-activated conductive spinel material for PCB via overcurrent protection.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process of utilizing a heat-activated conductive spinel material for printed circuit board (PCB) via overcurrent protection, the process comprising:
    forming a PCB laminate structure that includes a spinel-doped insulator layer, the spinel-doped insulator layer including a heat-activated conductive spinel material incorporated into a dielectric material as a spinel-based electrically non-conductive metal oxide;
    forming a sensing via in the PCB laminate structure at a location that is proximate to a power via in the PCB laminate structure, the sensing via electrically isolated from the power via by a region of the spinel-doped insulator layer; and
    electrically connecting the sensing via to a monitoring component, wherein the monitoring component is configured to detect current flow through the sensing via, the current flow resulting from an overcurrent event in the power via generating sufficient heat to cause the spinel-based electrically conductive metal oxide to release metal nuclei into the region to provide a conductive pathway through the region from the power via to the sensing via.

2. The process of claim 1, further comprising performing a corrective action responsive to the monitoring component detecting current flow through the sensing via.

3. The process of claim 2, wherein the corrective action includes disabling a power source or preventing current flow through the power via.

4. The process of claim 1, wherein the spinel-based electrically non-conductive metal oxide includes a spinel-based higher oxide containing at least two different cation types and that has a spinel structure or a spinel-related structure.

5. The process of claim 4, wherein the spinel-based electrically non-conductive metal oxide includes a mixed metal oxide.

6. The process of claim 4, wherein the spinel-based electrically non-conductive metal oxide includes a copper-containing material.

7. The process of claim 1, wherein the spinel-doped insulator layer is disposed between two ground reference planes of the PCB laminate structure.

8. The process of claim 1, wherein the spinel-doped insulator layer is disposed between a ground reference plane of the PCB laminate structure and a power plane of the PCB laminate structure.

9. The process of claim 1, wherein the spinel-doped insulator layer is formed from a pre-impregnated material that is doped with the spinel-based electrically non-conductive metal oxide.

10. A system for printed circuit board (PCB) via overcurrent protection, the system comprising:
   a PCB laminate structure that includes a spinel-doped insulator layer, the spinel-doped insulator layer including a heat-activated conductive spinel material incorporated into a dielectric material as a spinel-based electrically non-conductive metal oxide;
   a power via disposed within the PCB laminate structure;
   a sensing via disposed within the PCB laminate structure at a location that is proximate to the power via, wherein the sensing via is electrically isolated from the power via by a region of the spinel-doped insulator layer; and
   a monitoring component electrically connected to the sensing via, wherein the monitoring component is configured to perform a corrective action responsive to detecting current flow through the sensing via that results from an overcurrent event in the power via.

11. The system of claim 10, wherein the overcurrent event in the power via generates sufficient heat to cause the spinel-based electrically conductive metal oxide to release metal nuclei into the region to provide a conductive pathway through the region from the power via to the sensing via.

12. The system of claim 11, wherein the corrective action includes disabling a power source or preventing current flow through the power via.

13. The system of claim 10, further comprising:
   a second power via disposed within the PCB laminate structure, wherein the sensing via is electrically isolated from the second power via by a second region of the spinel-doped insulator layer; and
   wherein the monitoring component is configured to perform a second corrective action responsive to detecting current flow through the sensing via that results from an overcurrent event in the second power via.

14. The system of claim 13, wherein the overcurrent event in the second power via generates sufficient heat to cause the spinel-based electrically conductive metal oxide to release metal nuclei into the second region to provide a conductive pathway through the second region from the second power via to the sensing via.

15. The system of claim 14, wherein the corrective action includes disabling a power source or preventing current flow through the second power via.

16. The system of claim 10, further comprising an active component that is electrically connected to the monitoring component, the active component corresponding to a processor, an application specific integrated circuit (ASIC), or a field programmable gate array (FPGA).

17. A printed circuit board comprising:
   a PCB laminate structure that includes a spinel-doped insulator layer, the spinel-doped insulator layer including a heat-activated conductive spinel material incorporated into a dielectric material as a spinel-based electrically non-conductive metal oxide;
   a power via disposed within the PCB laminate structure;
   a sensing via disposed within the PCB laminate structure at a location that is proximate to the power via, wherein the sensing via is electrically isolated from the power via by a region of the spinel-doped insulator layer; and
   an electrical connector to connect the sensing via to a monitoring component, the monitoring component configured to detect current flow through the sensing via that results from an overcurrent event in the power via.

18. The printed circuit board of claim 17, wherein the overcurrent event in the power via generates sufficient heat to cause the spinel-based electrically conductive metal oxide to release metal nuclei into the region to provide a conductive pathway through the region from the power via to the sensing via.

19. The printed circuit board of claim 17, wherein the spinel-doped insulator layer is disposed between two ground reference planes of the PCB laminate structure.

20. The printed circuit board of claim 17, wherein the spinel-doped insulator layer is disposed between a ground reference plane of the PCB laminate structure and a power plane of the PCB laminate structure.

* * * * *